(12) United States Patent
Foxall et al.

(10) Patent No.: US 7,235,971 B2
(45) Date of Patent: Jun. 26, 2007

(54) SHIMMING OF MRI SCANNER INVOLVING FAT SUPPRESSION AND/OR BLACK BLOOD PREPARATION

(75) Inventors: David L. Foxall, Mentor, OH (US); Wim M. Prins, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/564,048

(22) PCT Filed: Jul. 7, 2004

(86) PCT No.: PCT/IB2004/002223

§ 371 (c)(1),
(2), (4) Date: Jan. 9, 2006

(87) PCT Pub. No.: WO2005/006008

PCT Pub. Date: Jan. 20, 2005

(65) Prior Publication Data

US 2006/0164082 A1 Jul. 27, 2006

Related U.S. Application Data

(60) Provisional application No. 60/486,633, filed on Jul. 11, 2003.

(51) Int. Cl.
*G01V 3/00* (2006.01)
(52) U.S. Cl. ...................................... 324/307
(58) Field of Classification Search ................ 324/307, 324/309
See application file for complete search history.

(56) References Cited

U.S. PATENT DOCUMENTS

| 5,271,399 A | * | 12/1993 | Listerud et al. ............. 600/419 |
| 5,432,447 A | | 7/1995 | Song .......................... 324/309 |
| 5,539,316 A | | 7/1996 | Sukumar ..................... 324/320 |

(Continued)

FOREIGN PATENT DOCUMENTS

| EP | 0 393 758 A1 | 10/1990 |
| EP | 0 949 512 A2 | 10/1999 |

OTHER PUBLICATIONS

Gruetter, R., et al.; Fast, Noniterative Shimming of Spatially Localized Signals; 1992; J. Mag. Res.; 96(2)323-334.

(Continued)

*Primary Examiner*—Diego Gutierrez
*Assistant Examiner*—Dixomara Vargas

(57) ABSTRACT

In a method for shimming a magnetic resonance imaging scanner (10), at least one of fat suppression and blood suppression is performed to suppress magnetic resonance from a corresponding at least one of fat and blood. First and second magnetic resonance echoes emanating from a generally columnar volume are measured. The measurements of the first and second magnetic resonance echoes (122, 124) are reconstructed (150) into corresponding first and second generally columnar projection images (152, 154). The first and second generally columnar projection images are combined (160) to produce a magnetic field profile (174) of the generally columnar volume. Selected magnetic field parameters are extracted (142) from the magnetic field profile. Shim currents are computed (180) from the selected magnetic field parameters. The shim currents are applied to magnetic field coils (16, 60).

25 Claims, 3 Drawing Sheets

U.S. PATENT DOCUMENTS

Figure 1:
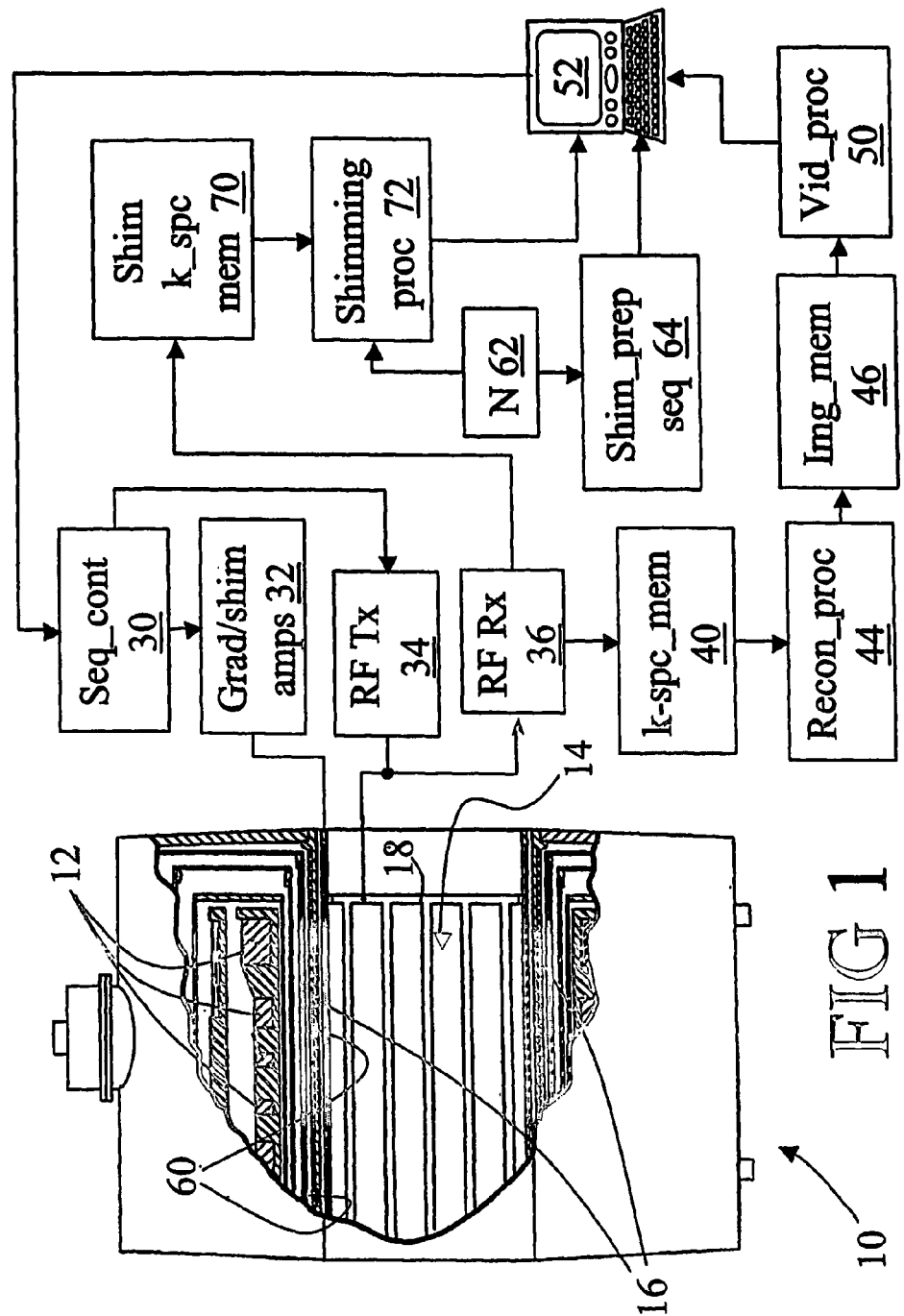

| | | | | |
|---|---|---|---|---|
| 5,560,360 | A | * | 10/1996 | Filler et al. ............... 600/408 |
| 5,617,029 | A | * | 4/1997 | Schneider ................. 324/320 |
| 6,240,311 | B1 | * | 5/2001 | Prince ..................... 600/420 |
| 6,295,465 | B1 | | 9/2001 | Simonetti ................. 600/413 |
| 6,486,667 | B1 | | 11/2002 | Wu et al. ................. 324/306 |
| 6,529,002 | B1 | | 3/2003 | Kim et al. |
| 6,842,638 | B1 | * | 1/2005 | Suri et al. ................. 600/425 |
| 2004/0133098 | A1 | * | 7/2004 | Yarnykh et al. ........... 600/419 |

OTHER PUBLICATIONS

Gruetter, R., et al.; Field Mapping without Reference Scan Using Asymmetric Echo-Planar Techniques; 2000; MRM; 43:319-323.

Kanayama, S., et al.; In Vivo Rapid Magnetic Field Measurement and Shimming Using Single Scan Differential Phase Mapping; 1996; MRM; 36:637-642.

Schar, M., et al.; Considerations on Shimming for Cardiac Applications at 1.5 and 3.0T; 2003; Proc. Intl. Soc. Mag. Reson. Med.; 11; p. 174.

Schneider, E., et al.; Rapid In Vivo Proton Shimming; 1991; MRM; 18:335-347.

Shen, J.; Effect of degenerate spherical harmonics and a method for automatic shimming of oblique Slices; 2001; NMR in Biomed.; 14:177-183.

Shen, J., et al.; Linear Projection Method for Automatic Slice Shimming; 1999; MRM; 42; pp. 1082-1088.

Shen, J., et al.; Improvements on an in Vivo Automatic Shimming Method (FASTERMAP); 1997; MRM; 38:834-839.

Webb, P., et al.; Rapid, Fully Automatic, Arbitrary-Volume in Vivo Shimming; 1991; MRM; 20(1)113-122.

* cited by examiner

US 7,235,971 B2

SHIMMING OF MRI SCANNER INVOLVING FAT SUPPRESSION AND/OR BLACK BLOOD PREPARATION

CROSS REFERENCE TO RELATED APPLICATIONS

This application claims the benefit of U.S. provisional application Ser. No. 60/486,633 filed Jul. 11, 2003, which is incorporated herein by reference.

The following relates to the diagnostic imaging arts. It finds particular application in magnetic resonance imaging, and will be described with particular reference thereto. However, it also finds more general application in nuclear magnetic resonance characterization techniques such as magnetic resonance spectroscopy.

Magnetic field nonuniformities in magnetic resonance imaging scanners are known to introduce imaging and spectroscopy artifacts. These artifacts are particularly severe at higher magnetic fields and for certain techniques, such as for steady state free procession (SSFP) imaging in which magnetic field nonuniformities produce banding defects, and chemical shift imaging in which poor field uniformity produces spectral line broadening and shifting.

Magnetic field nonuniformities are addressed in the first instance in design of the main magnet, which is typically a superconducting coil, although resistive main magnet coils are also used. Magnetic field uniformity is also improved through the use of selectively placed steel shims. Further improvement is obtained through the use of active shimming. In this technique, shim coils produce auxiliary magnetic field gradients that combine with the magnetic field produced by the main magnet to generate a more uniform overall field. Alternatively or additionally, offset currents can be applied to main gradient coils to provide active shimming. Advantageously, active shimming permits the radiologist to optimize field uniformity for a specific imaging session by performing preparatory pre-scan magnetic field measurements on the imaged region of the subject and adjusting the shim currents based on these subject measurements.

Previous methods and pulse sequences for performing the magnetic field measurements and extracting shimming information therefrom have suffered from certain disadvantages. Accurate measurement of the magnetic fields has been hindered by artifacts introduced by resonance frequency shifts of fatty tissue, dephasing of the magnetic resonance in flowing blood, and cardiac cycling motion artifacts. Extraction of quantitative information has been further hindered by phase ambiguities across spatial regions of low magnetic resonance signal such as air in the lungs. As a consequence, active shimming has in practice employed collection of overdetermined data sets to ensure reasonable shimming accuracy. Even so, active shimming has generally in the past been limited to correction of first order magnetic field nonuniformities.

The present invention contemplates an improved apparatus and method that overcomes the aforementioned limitations and others.

According to one aspect, a method is provided for shimming a magnetic resonance imaging scanner. At least one of fat suppression and moving blood suppression is performed to suppress magnetic resonance from at least one region of fat and removing blood. First and second magnetic resonance echoes emanating from a generally columnar volume are measured. The measurements of the first and second magnetic resonance echoes are reconstructed into corresponding first and second generally columnar projection images. The first and second generally columnar projection images are combined to produce a magnetic field profile of the generally columnar volume. Selected magnetic field parameters are extracted from the magnetic field profile. Shim currents are computed from the selected magnetic field parameters. The shim currents are applied to magnetic field coils.

According to another aspect, an apparatus is disclosed for shimming a magnetic resonance imaging scanner. A selective resonance suppression means is provided for performing at least one of suppression of magnetic resonance in fat and suppression of magnetic resonance in blood. A means is provided for measuring first and second magnetic resonance echoes emanating from a generally columnar volume. A means is provided for reconstructing the measurements of the first and second magnetic resonance echoes into corresponding first and second generally columnar projection images. A means is provided for combining the first and second generally columnar projection images to produce a magnetic field profile of the generally columnar volume. A means is provided for extracting selected magnetic field parameters from the magnetic field profile. A means is provided for computing a shim current from the selected magnetic field parameters. A means is provided for applying the shim current to a magnetic field gradient coil.

One advantage resides in improved handling of phase ambiguities in phase-based magnetic field measurements.

Another advantage resides in suppression of magnetic resonance from fat and blood regions during magnetic field mapping.

Yet another advantage resides in more efficient active shimming by reducing the number of field projection measurements and avoiding overdetermined sets of linear equations in the shimming calculations.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including active shimming.

Figure 2:
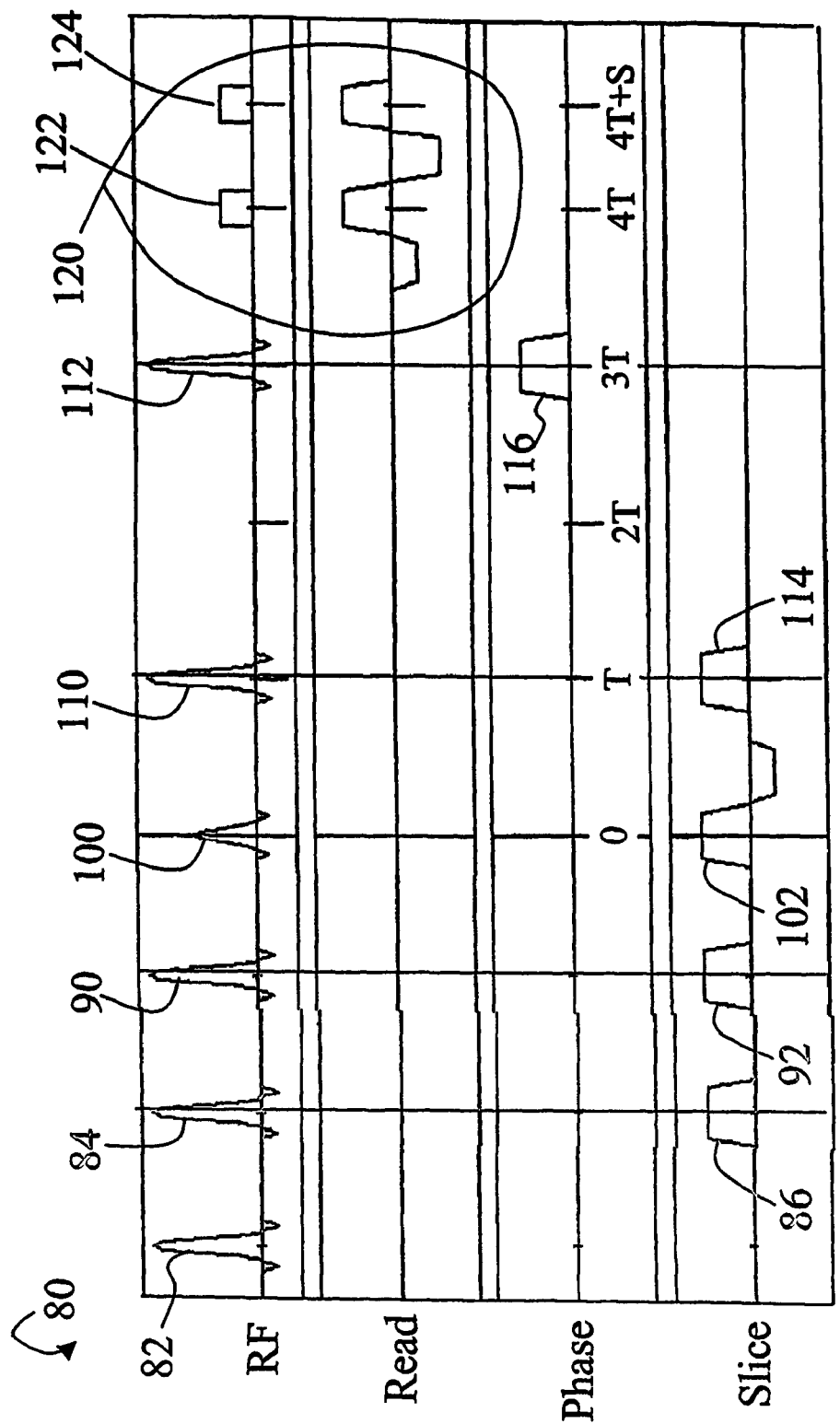

FIG. 2 shows a preferred magnetic resonance sequence for performing the magnetic field measurements.

Figure 3:
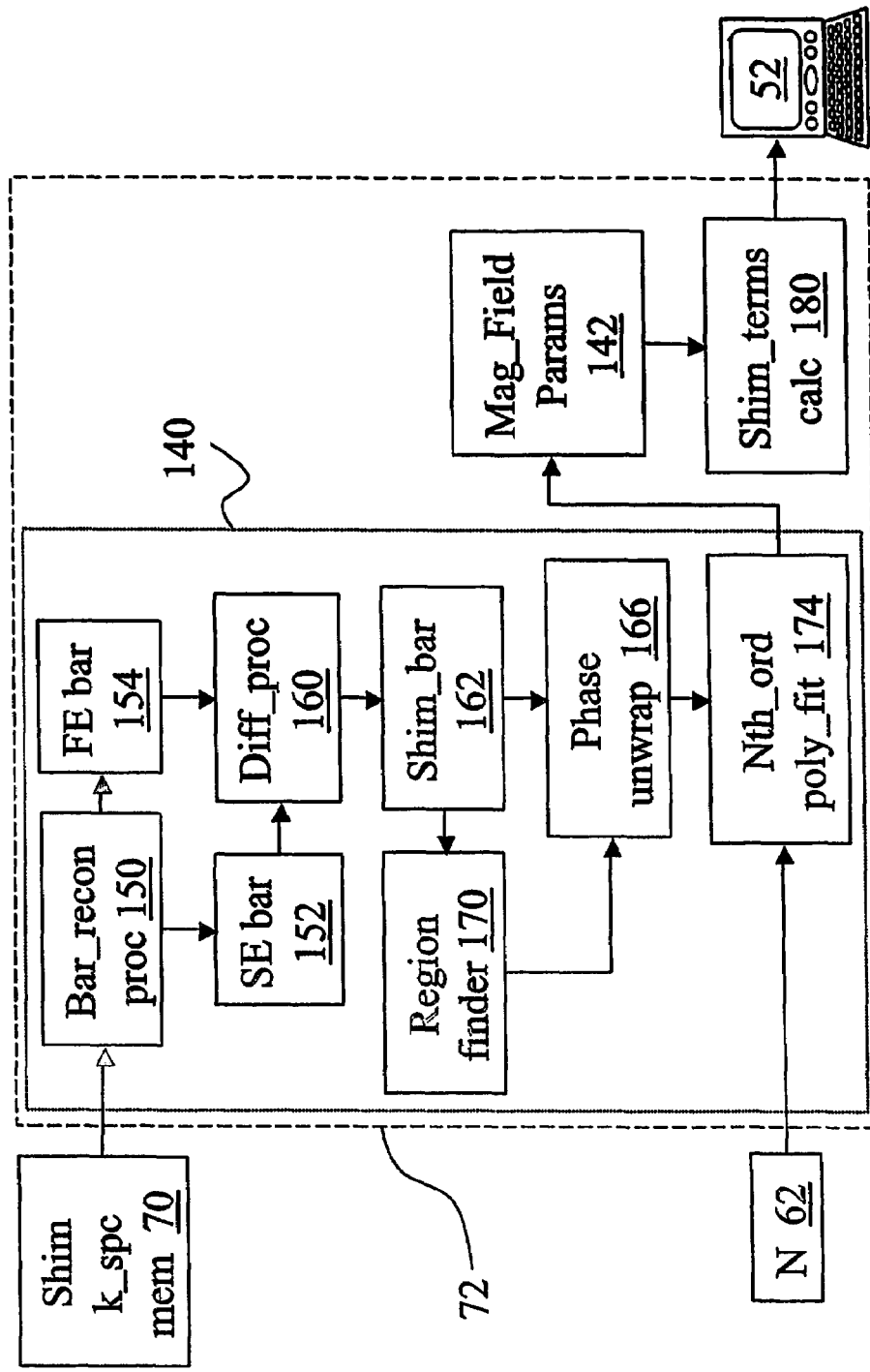

FIG. 3 diagrammatically shows details of the shimming processor of FIG. 1.

With reference to FIG. 1, a magnetic resonance imaging scanner 10 includes main magnet coils 12, which are preferably superconducting coils, although resistive main magnet coils or permanent magnet material can also be employed. The main magnet coils 12 are energized to generate a substantially uniform main ($B_o$) magnetic field in an examination region 14. Magnetic field gradient coils 16 produce gradients in selected spatial directions to spatially encode magnetic resonances that are generated by energizing a radio frequency coil 18. In FIG. 1, a whole-body radio frequency coil 18 is shown; however, local coils such as head coils, phased radio frequency coil arrays, SENSE coils, and the like can be used instead of or in conjunction with the whole-body radio frequency coil 18 to excite magnetic resonances or to detect magnetic resonance echoes.

A magnetic resonance sequence controller 30 coordinates and controls magnetic field gradient/shim controllers 32 coupled to the gradient coils 16 and a radio frequency transmitter 34 coupled to the whole-body radio frequency coil 18 or another radio frequency coil to excite and spatially encode magnetic resonance echoes. One or more radio frequency receivers 36 coupled to the whole-body radio frequency coil 18 or another radio frequency coil detects, demodulates, and digitizes the magnetic resonance echoes and stores digital magnetic resonance samples in a k-space memory 40. A reconstruction processor 44 performs a Fourier transform-based image reconstruction or other type of image reconstruction to generate one or more reconstructed images from the stored k-space magnetic resonance samples.

The reconstructed images are stored in an image memory 46, processed by a video processor 50 and displayed on a user interface 52, transmitted over a local computer network or the Internet, or otherwise processed. Preferably, the user interface 52 includes a display, printer, or other output device that allows a radiologist or other operator to view, render, or otherwise manipulate the reconstructed images. Moreover, the user interface 52 preferably enables the radiologist or other operator to communicate with the magnetic resonance sequence controller 30 to create magnetic resonance imaging sequences, modify imaging sequences, execute imaging sequences, or otherwise control the magnetic resonance imaging scanner 10.

Those skilled in the art recognize that the uniformity of the main ($B_o$) magnetic field is a substantial factor controlling the accuracy of the reconstructed images. $B_o$ field non-uniformities can introduce artifacts such as banding defects in steady state free procession (SSFP) imaging. To reduce such field non-uniformities, active shim coils 60 are selectively energized to produce auxiliary magnetic field gradients that compensate for non-uniformities of the main $B_o$ field. Additionally or alternatively, offset currents are applied to the main magnetic field gradient coils 16 to provide the active shimming.

In order to determine appropriate shim or offset currents, non-uniformities of the main $B_0$ field are preferably measured using a preparatory pre-scan magnetic resonance sequence after the imaging subject is positioned in the scanner 10. For shimming of magnetic field non-uniformities of order N 62, a suitable preparatory magnetic resonance sequence is recalled via the user interface 52 from a shimming preparatory sequences memory 64. In a preferred embodiment, correction is performed at least for second order (N=2) magnetic field non-uniformities. The sequence controller 30 executes the recalled preparatory sequence to cause selected magnetic resonance echoes to be generated and measured, with the measurement samples being stored in a shimming k-space memory 70. A shimming processor 72 analyzes the measured echoes and computes suitable shim or offset currents to apply to the active shim coils 60 or the main magnetic field gradient coils 16 to compensate for the measured magnetic field non-uniformities. Preferably, the measurements are performed in the area to be imaged and with the imaging subject situated in the examination region 14.

With reference to FIG. 2, a preferred preparatory shimming magnetic resonance sequence 80 is described. The sequence 80 employs phase-sensitive imaging of a generally columnar volume defining a projection direction. Moreover, the shimming magnetic resonance sequence 30 provides suppression of magnetic resonance from fat tissues using a fat saturation preparation. This suppression is advantageous because the spectral resonance shift between fat and water causes apparent dephasing that interferes with phase-based shimming measurements. Similarly, the sequence 80 provides suppression of magnetic resonance from blood using a black blood preparation. This suppression is advantageous because rapid blood flow causes resonance dephasing that also interferes with phase measurements.

In the preparatory magnetic resonance sequence 80, a black blood preparation includes a non-selective 180° radio frequency pulse 82 that inverts spins in the subject. A second 180° radio frequency pulse 84 in conjunction with a slice-select gradient pulse 86 reinserts the static spins of the slice of interest. A delay following the two inversion pulses 82, 84 provides time for blood to flow out of the slice of interest and for the magnetic resonance signal of the blood to relax toward the null condition. Before the blood is fully nulled, a third 180° radio frequency pulse 90 in conjunction with a second slice-select gradient pulse 92 inverts the spins in the slice. A delay following the inversion pulse 90 is selected such that both inverted blood flowing into the slice and the magnetic resonance signal of the fat reach the null condition at a time when the slice is excited with a 90° radio frequency pulse 100 in conjunction with a slice-select gradient pulse 102. The magnetic resonance of the excited slice is refocused using a pair of 180° radio frequency pulses 110, 112 in conjunction with two spatially transverse gradient pulses 114, 116 to define a generally columnar volume of interest.

Magnetic resonance echoes from the generally columnar volume of interest are measured with a short echo planar sequence 120 that reads a spin echo 122 and a field or gradient echo 124. The sequence 80 is a symmetric sequence: the refocusing 180° radio frequency pulses 110, 112 are spaced at intervals T and 3T, respectively, from the 90° radio frequency excitation pulse 100, and the spin echo is read at about an interval of 4T from the 90° radio frequency excitation pulse 100. The field echo is read at an interval 4T+S from the 90° radio frequency excitation pulse 100, where the sub-interval S is selected to correspond to the multiple of the fat-water period. The fat-water period is the inverse of the frequency separation of the fat and water magnetic resonance signals. The sub-interval S is preferably a small multiple of the fat-water period, and more preferably the multiple is unity. With the spin echo and the field echo temporally separated by a multiple of the fat-water period, a phase difference between one-dimensional projection images reconstructed from the spin echo and the field echo, respectively, advantageously substantially corresponds to spin evolution under the influence of the local magnetic field. Contributions due to the fat-water chemical shift are advantageously suppressed by setting the sub-interval S to a small multiple of the fat-water period, as well as by the fat saturation preparation.

The sequence 80 is preferably a symmetric sequence selected to provide compensation for slowly varying field terms due to longer duration eddy currents and field drift due to passive shims, booster iron, and the like. Phase shifts due to field terms with linear variation cancel at the second spin echo. Optionally, however, the preferred dual echo sequence 80 can be replaced by a single 90°-180° pulse pair. Moreover, while in the sequence 80 the fourth echo is read by the short echo planar sequence 120, those skilled in the art can readily modify the sequence 80 to read flow-compensated third, fifth, sixth, or otherwise-indexed spin echoes. Still further, a stimulated echo can be substituted for the spin echo in the preparatory sequence 80.

The sequence 80 is repeated for a plurality of spatial orientations of generally columnar volumes of interest. To extract magnetic field parameters of order N, P projections along at least 2N+1 directions are measured. Thus, to extract second order magnetic field parameters where N=2, at least five orientations are measured. For N=3, at least seven orientations are measured. Measurement of a properly selected 2N+1 orientations of the generally columnar volume of interest allows for correction values for N(N+2) shim coils to be computed for magnetic field corrections up to and including order N. Optionally, more than 2N+1 orientations are measured; however, this produces an overdetermined system of linear equations and substantially reduces efficiency. Hence, in a preferred embodiment, the least number of orientations, namely a selected 2N+1 orientations, are measured.

Using conventional spherical coordinate notation ($\theta$, $\phi$), appropriate orientations for the least number 2N+1 of generally columnar volumes of interest are selected according to:

$$\theta_k = \frac{\pi}{2(1+N_\theta)}(1+2k), \quad k = 0, 1, \ldots (N_\theta - 1), \quad (1)$$

and:

$$\phi_j = \frac{\pi}{N_\phi}(1+2j), \quad j = 0, 1, \ldots (N_\phi - 1), \quad (2)$$

where $N_\theta$ is a number of $\theta$ coordinate values, $N_\phi$ is a number of $\phi$ coordinate values. The product $N_\theta \cdot N_\phi$ is equal to the total number of collected projections P, and the value of $N_{100}$ is chosen so that $N_\phi \geq 2N+1$.

As an example of the use of Equations (1) and (2), for second order shimming where N=2, the least number of orientations is 2N+1=5. Selecting $N_\theta=1$ and $N_\phi=5$, an appropriate set of orientations is given by Equations (1) and (2) as: (45°, 36°), (45°, 108°), (45°, 180°), (45°, 252°), and (45°, 324°). Equations (1) and (2) can be readily employed to compute appropriate sets of orientations for first order, third order, or higher order shimming as well.

With reference to FIG. 3, the shim k-space memory 70 stores k-space data for the spin echo and field echo acquired for each selected orientation of the generally columnar volume of interest. The shimming processor 72 processes this data to compute shimming currents or offset currents to implement the shimming. An iterative loop process 140 repeats the preparatory sequence 80 to acquire data for each orientation, and processes the k-space data for each orientation to compute magnetic field parameters along that orientation, which are stored in a magnetic field parameters memory 142. In a preferred embodiment, a bar reconstruction processor 150 applies a filtered one-dimensional Fourier transform to reconstruct a spin echo columnar projection image 152 from the spin echo data. The bar reconstruction processor 150 also applies the filtered Fourier transform to reconstruct a field echo columnar projection image 154 from the field echo data.

A difference processor 160 combines the spin echo projection image 152 and the field echo projection image 154 to produce a shim bar projection 162 having a phase that is substantially due to spin evolution under the influence of the local magnetic field. Representing values of the two projections 152, 154 by complex numbers $Z_1$ and $Z_2$, and values of the shim bar projection 162 as complex number $Z_3$, the shim bar projection 162 is suitably computed as $Z_3=Z_2 \cdot Z_1^*$, where $Z_1^*$ is the complex conjugate of $Z_1$. The shim bar projection 162 is a phase-wrapped shim bar projection. That is, the phase values of the shim bar projection 162 lie between 0 and $2\pi$. A phase unwrap processor 166 unwraps the phase to remove phase discontinuities. Phase unwrapping is suitably accomplished by adding appropriate multiples of $2\pi$ to the phase values to remove phase discontinuities.

Typical phase unwrapping algorithms can produce ambiguous or erroneous results in regions of low magnetic resonance signal. To address this difficulty, a region finder 170 preferably analyzes the shim bar projection 162 to identify a largest usable region of substantial magnetic resonance signal. In one suitable approach, a global mean of the amplitude values of the phase-wrapped shim bar projection 162 is computed. Looping through the data, local mean values over short windows of typically three to seven data points are computed. The local mean values are compared with the global mean value. Transition points at which the local mean increases above the global mean indicate transitions between an unusable region and a usable region. Similarly, transition points at which the local mean decreases below the global mean indicate transitions between a usable region and an unusable region. The largest usable region is preferably unwrapped by the unwrapping processor 166, and this unwrapped shim bar portion is used in subsequent processing.

The unwrapped shim bar projection or projection portion is fit to a polynomial of order N 62 by an Nth-order polynomial fitting processor 174 to extract the magnetic field parameters of order N 62 which are stored in the magnetic field parameters memory 142. In a preferred approach, the method of orthogonal polynomials is used in the fitting process; however, other polynomial fitting methods can be employed. The iterative loop process 140 invokes the bar reconstruction processor 150, the difference processor 160, the phase unwrapping processes 166, 170, and the polynomial fitting processor 174 for each orientation selected using Equations (1) and (2), and the resulting magnetic field parameters for the various selected orientations are stored in the magnetic field parameters memory 142.

A shim terms calculation processor 180 computes shim terms based on the magnetic field parameters of the various measured shim bar orientations. If shim orientations given by Equations (1) and (2) are used, then a least number of orientations are measured, and the linear equations relating the shim currents to the highest order magnetic field parameters are exactly determined. Advantageously, the choice of orientations according to Equations (1) and (2) ensures that the linear equations are fully decoupled and that the [W] matrix of Equation (4) is such that $[W][W]^T$ is a diagonal matrix even when an overdetermined measurement is made. In this case, computation of the shim currents reduces to algebraic calculations. The shim terms $L_{shim}$ are given by:

$$L_{shim} = \frac{\sum W_{shim}(\theta_k, \phi_k) \cdot A_{order,k}}{\sum W_{shim}(\theta_k, \phi_k) \cdot W_{shim}(\theta_k, \phi_k)}, \quad (3)$$

where $W_{shim}(\theta,\phi)$ denotes the angular part of a spherical harmonic function and $A_{order,k}$ denotes the fitted polynomial coefficients of the indicated order. On the other hand, if orientations different from those given by Equations (1) and (2) are measured it is possible to have an inconsistent set of linear equations relating magnetic field parameters and shim currents. Even if orientations are measured that lead to consistent sets of coupled linear equations, these may be overdetermined at the highest shim order or at least for the lower shim orders. In this case the shim terms calculation processor 180 can compute shim terms directly from the matrix equation:

$$[A]=[W][L] \quad (4),$$

where [A] is the polynomial coefficients matrix, [L] is the shim terms matrix, and [W] is the spherical harmonic functions matrix. Solution of matrix Equation (4) employs a less efficient algorithm that is suitable for solving overdetermined systems of linear equations. For overdetermined systems, singular value decomposition of the [W] matrix is preferably used to provide a solution that minimizes the effect of measurement error in the least squares sense.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A method for shimming a magnetic resonance imaging scanner, the method including:
   performing a black blood preparation to suppress magnetic resonance from moving blood;
   measuring first and second magnetic resonance echoes emanating from a generally columnar volume;
   reconstructing the measurements of the first and second magnetic resonance echoes into corresponding first and second generally columnar projection images;
   combining the first and second generally columnar projection images to produce a magnetic field profile of the generally columnar volume;
   extracting selected magnetic field parameters from the magnetic field profile;
   computing shim currents from the selected magnetic field parameters;
   applying the shim currents to magnetic field coils; and
   generating an image with the magnetic resonance scanner.

2. The method as set forth in claim 1, wherein the first and second magnetic resonance echoes include a spin echo and a field echo.

3. The method asset forth in claim 1, further including:
   interposing a delay corresponding to a multiple of a fat-water period between the measuring of the first magnetic resonance echo and the measuring of the second magnetic resonance echo to suppress magnetic resonance from fat.

4. The method as set forth in claim 1, wherein the measuring of first and second magnetic resonance echoes employs a symmetric echo sequence in which echoes are spaced by a selected time interval.

5. The method as set forth in claim 1, wherein the combining of the first and second generally columnar projection images to produce a magnetic field profile includes:
   computing a phase difference between the first and second generally columnar projection images to produce a phase-wrapped magnetic field profile; and
   phase unwrapping the phase-wrapped magnetic field profile.

6. The method as set forth in claim 5, further including:
   identifying at least one usable region that is bounded by unusable regions of low magnetic resonance signal; and
   phase unwrapping the at least one usable region.

7. The method as set forth in claim 1, further including:
   performing a fat saturation preparation.

8. The method as set forth in claim 1, wherein the measuring of first and second magnetic resonance echoes emanating from a generally columnar volume includes:
   selecting the generally columnar volume using two transverse slice-selective pulses.

9. A method of shimming a magnetic resonance imaging scanner, the method including:
   performing at least one of fat suppression and moving blood suppression to suppress magnetic resonance from at least one region of fat and moving blood;
   measuring first and second magnetic resonance echoes emanating from a generally columnar volume;
   reconstructing the measurements of the first and second magnetic resonance echoes into corresponding first and second generally columnar projection images;
   computing a phase difference between the first and second generally columnar projection images to product a phase-wrapped magnetic field profile;
   computing a mean of the phase-wrapped magnetic field profile;
   identifying boundaries of at least one usable region corresponding to mean crossings;
   phase unwrapping the at least one usable region;
   extracting selected magnetic field parameters from a base unwrapped magnetic field profile of the usable region;
   computing shim currents from the selected magnetic field parameters;
   applying the shim currents to magnetic field coils; and
   generating an image with the magnetic resonance scanner.

10. The method as set forth in claim 9, further including:
    repeating the performing of at least one of fat suppression and moving blood suppression and the measuring, reconstructing, combining, and extracting for a plurality of spatial orientations of the generally columnar volume, the computing of a shim current being based on the selected magnetic field parameters obtained at the plurality of spatial orientations.

11. The method as set forth in claim 10, wherein the plurality of spatial orientations include 2N+1 spatial orientations where N is a highest order shimming correction of the selected magnetic field parameters to be performed, the spherical θ coordinate is computed as:

$$\theta_k = \frac{\pi}{2(1+N_\theta)}(1+2k), \quad k = 0, 1, \ldots (N_\theta - 1)$$

and the spherical φ coordinate is computed as:

$$\phi_j = \frac{\pi}{N_\phi}(1+2j), \quad j = 0, 1, \ldots (N_\phi - 1)$$

where $N_\theta$ is a number of θ coordinate values, $N_\phi$ is a number of φ coordinate values, the product $N_\theta \cdot N_\phi$ is the number of spatial orientations to be measured, and $N_\phi \geq 2N+1$.

12. The method as set forth in claim 11, wherein $N_\theta$ equals unity.

13. A method of shimming a magnetic resonance imaging scanner, the method including:
    performing at least one of fat suppression and moving blood suppression to suppress magnetic resonance from at least one region of fat and moving blood;

measuring first and second magnetic resonance echoes emanating from a generally columnar volume;

reconstructing the measurements of the first and second magnetic resonance echoes into corresponding first and second generally columnar projection images;

combining the first and second generally columnar projection images to produce a magnetic field profile of the generally columnar volume;

extracting selected magnetic field parameters from the magnetic field profile;

computing shim currents from the selected magnetic field parameters;

repeating the performing of at least one of fat suppression and moving blood suppression and the measuring, reconstructing, combining, and extracting for a plurality of spatial orientations of the generally columnar volume, the computing of a shim current being based on the selected magnetic field parameters obtained at the plurality of spatial orientations, the plurality of spatial orientations include at least five spatial orientations, and the extracting selected magnetic field parameters for each spatial orientation including:

performing a high-order polynomial fit of order greater than or equal to two of the magnetic field profile to obtain second or higher order magnetic field terms;

applying the shim currents to magnetic field coils; and generating an image with the magnetic resonance scanner.

14. The method as set forth in claim 13, wherein the plurality of spatial orientations include exactly five spatial orientations.

15. The method as set forth in claim 14, wherein the five spatial orientations are selected as one of:

the set of orientations (45°, 36°), (45°, 108°), (45°, 180°), (45°, 252°), (45°, 324°), and the set of orientations (15°, 180°), (45°, 180°), (75°, 180°), (105°, 180°), (135°, 180°), where within each set each orientation is indicated by spherical coordinates (θ, φ).

16. The method as set forth in claim 13, wherein the plurality of spatial orientations includes 2N+1, wherein N is a highest magnetic field term.

17. The method as set forth in claim 13, wherein the plurality of spatial orientations include exactly seven spatial orientations to obtain third order magnetic field terms.

18. An apparatus for shimming a magnetic resonance imaging scanner, the apparatus including:

a means for measuring first and second magnetic resonance echoes emanating from a generally columnar volume;

a means for performing a black blood preparation prior to the measuring of the first and second magnetic resonance echoes;

a means for performing a fat saturation preparation;

a means for reconstructing the measurements of the first and second magnetic resonance echoes into corresponding first and second generally columnar projection images;

a means for combining the first and second generally columnar projection images to produce a magnetic field profile of the generally columnar volume;

a means for extracting selected magnetic field parameters from the magnetic field profile;

a means for computing shim currents from the selected magnetic field parameters; and a means for applying the shim currents to magnetic field coils.

19. The apparatus as set forth in claim 18, wherein the first and second magnetic resonance echoes include a spin echo and a field echo, and the means for measuring interposes a delay between the measuring of the first magnetic resonance echo and the measuring of the second magnetic resonance echo, the delay corresponding to a multiple of an inverse of a fat-water resonance frequency difference.

20. The apparatus as set forth in claim 18, wherein the means for measuring implements a symmetric echo sequence in which echoes are spaced by a selected time interval.

21. The apparatus as set forth in claim 18, wherein the means for combining includes:

a means for computing a phase difference between the first and second generally columnar projection images to produce a phase-wrapped magnetic field profile;

a means for identifying at least one usable region that is bounded by unusable regions of low magnetic resonance signal; and a means for phase unwrapping at least one usable region.

22. The apparatus as set forth in claim 18, wherein the means for computing a shim current includes:

a means for iteratively invoking the selective resonance suppression means, the means for measuring, the means for reconstructing, the means for combining, and the means for extracting for a plurality of generally columnar volume orientations; and a means for solving linear equations to compute the shim current based on the selected magnetic field parameters at the plurality of generally columnar volume orientations.

23. The apparatus as set forth in claim 22, wherein each of the plurality of generally columnar volume orientations are gated to a cyclic physiological motion.

24. An apparatus for shimming a magnetic resonance imaging scanner, the apparatus including:

a selective resonance suppression means for performing at least one of suppression of magnetic resonance in fat and suppression of magnetic resonance in moving blood;

a means for measuring first and second magnetic resonance echoes emanating from a generally columnar volume;

a means for reconstructing the measurements of the first and second magnetic resonance echoes into corresponding first and second generally columnar projection images;

a means for combining the first and second generally columnar projection images to produce a magnetic field profile of the generally columnar volume;

a means for extracting selected magnetic field parameters from the magnetic field profile, the selected magnetic field parameters have order of N where N is 2 or more, a number of orientations equals 2N+1;

a means for solving linear equations to compute shim current based on the selected magnetic field parameters at the plurality of generally columnar volume orientations; and, a means for applying the shim currents to magnetic field coils.

25. The apparatus as set forth in claim 24, wherein N=2, the number of orientations equals 5, and each orientation has one of:

a spherical θ coordinate equal to 45° in common, and a spherical φ coordinate equal to 180° in common.

* * * * *